(12) United States Patent
Fuerhoff et al.

(10) Patent No.: US 6,454,851 B1
(45) Date of Patent: Sep. 24, 2002

(54) METHOD FOR PREPARING MOLTEN SILICON MELT FROM POLYCRYSTALLINE SILICON CHARGE

(75) Inventors: Robert H. Fuerhoff, St. Charles; Mohsen Banan, Grover; John D. Holder, St. Louis, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 92 days.

(21) Appl. No.: 09/711,198

(22) Filed: Nov. 9, 2000

(51) Int. Cl.[7] ............................................. C30B 15/26
(52) U.S. Cl. ....................................................... 117/15
(58) Field of Search ........................... 117/11, 13, 14, 117/15, 18, 30, 33

(56) References Cited

U.S. PATENT DOCUMENTS

| | | |
|---|---|---|
| 5,588,993 A | 12/1996 | Holder |
| 5,653,799 A | 8/1997 | Fuerhoff et al. |
| 5,656,078 A | 8/1997 | Fuerhoff et al. |
| 5,846,318 A | 12/1998 | Javidi |
| 5,882,402 A | 3/1999 | Fuerhoff et al. |
| 5,919,303 A * | 7/1999 | Holder .......................... 117/13 |
| 6,077,345 A * | 6/2000 | Easoz et al. ................... 117/14 |
| 6,106,612 A * | 8/2000 | White ........................... 117/14 |

* cited by examiner

Primary Examiner—Benjamin L. Utech
Assistant Examiner—Matthew Anderson
(74) Attorney, Agent, or Firm—Senniger, Powers, Leavitt & Roedel

(57) ABSTRACT

A method and apparatus for preparing molten silicon melt from polycrystalline silicon in a crystal pulling apparatus entails loading an amount of polycrystalline silicon loaded into the crucible less than a predetermined total amount of polycrystalline silicon to be melted. The crucible is heated to form a partially melted charge in the crucible having an island of unmelted polycrystalline silicon exposed above an upper surface of melted silicon. Granular polycrystalline silicon is fed from a feeder onto the island of unmelted polycrystalline silicon until the predetermined total amount of polycrystalline silicon has been loaded into the crucible. The position of the island relative to the crucible side wall is electronically determined as granular polycrystalline silicon is fed onto the island. The feed rate at which granular polycrystalline silicon is fed from the feeder onto the island of unmelted polycrystalline silicon is controlled in response to the determined position of the island relative to the crucible side wall.

7 Claims, 4 Drawing Sheets

ABOUT THE INVENTION# METHOD FOR PREPARING MOLTEN SILICON MELT FROM POLYCRYSTALLINE SILICON CHARGE

BACKGROUND OF THE INVENTION

The present invention generally relates to the production of single crystal silicon, and more particularly to a method and apparatus for preparing a molten silicon melt from polycrystalline silicon.

Most single crystal silicon used for microelectronic circuit fabrication is prepared by the Czochralski (CZ) process. In this process, a single crystal silicon ingot is produced by melting polycrystalline silicon in a crucible, dipping a seed crystal into the molten silicon, withdrawing the seed crystal in a manner sufficient to achieve the diameter desired for the ingot and growing the single crystal at that diameter. The polycrystalline silicon melted to form the molten silicon is typically irregularly shaped chunk polycrystalline silicon prepared by the Siemens process or, alternatively, free-flowing, generally spherically-shaped granular polycrystalline silicon, typically prepared by a fluidized-bed reaction process.

The initial charging of chunk type polycrystalline silicon into the crucible and the melting thereof can introduce undesirable impurities and defects into the single crystal silicon ingot. For example, when a crucible is initially charged entirely with chunk polycrystalline silicon, the edges of the chunks under the load of a full charge can scratch and gouge the crucible wall, resulting in a damaged crucible and in particles of crucible floating on or being suspended in the silicon melt. These impurities significantly increase the likelihood of dislocations forming within the single crystal, and decrease the dislocation-free single crystal production yields and throughput. Careful arrangement of the chunk-polycrystalline silicon during the initial loading can minimize the thermal stresses. As melting proceeds, however, the charge can shift or the lower portion of the chunk-polycrystalline silicon can melt away and leave either a "hanger" of unmelted material stuck to the crucible wall above the melt or a "bridge" of unmelted material bridging between opposing sides of the crucible wall over the melt. When the charge shifts or a hanger or bridge collapses, it may splatter molten silicon and/or cause mechanical stress damage to the crucible. Additionally, initial loadings of 100% chunk-polycrystalline silicon limits the volume of material which can be charged due to the poor packing densities of such chunk materials. The volume limitations directly impact single crystal throughput.

Problems similarly exist when a CZ crucible is initially charged entirely with granular polycrystalline silicon. Large amounts of power are required to melt the granular polycrystalline silicon due to its low thermal conductivity. The thermal stress induced in the crucible by exposure to such high meltdown-power can cause distortion of the crucible and particles of the crucible to be loosened and suspended in the melt. Like the mechanical stresses, these thermal stresses result in reduced crystal throughput. Other problems associated with initial charges comprising 100% granular polycrystalline silicon are disclosed below with respect to the present invention. Finally, although initial loadings of granular polycrystalline silicon may be volumetrically larger than that of 100% chunk polycrystalline silicon, they typically do not result in higher overall throughput, because the degree of thermal stress on the crucible increases with the size of initial loading.

Whether the crucible is initially loaded with chunk or granular polycrystalline silicon, in many processes it is desirable to add polycrystalline silicon to the melt with a feeding/metering system to increase the quantity of molten silicon in the crucible. The use of such additional loadings of charge-up polycrystalline silicon is known for batch, semi-continuous or continuous process systems. In the batch system, for example, additional polycrystalline silicon may be loaded into the existing melt to achieve full crucible capacity in light of the decrease in volume after the initial polycrystalline silicon charge is melted.

To this end, co-assigned U.S. Pat. No. 5,588,993 discloses a method for preparing molten silicon from polycrystalline silicon charge in which polycrystalline silicon, preferably chunk polycrystalline silicon, is loaded into a crucible and partially melted to form molten silicon and unmelted silicon having an upper surface extending above the molten silicon (otherwise referred to as the island of unmelted silicon). Granular polycrystalline silicon is fed onto the exposed, unmelted silicon until a desired total amount of polycrystalline silicon is loaded in the crucible. The granular polycrystalline silicon and the unmelted silicon are then fully melted to form a molten silicon melt. This method results in improved zero defect yield, throughput and mean hot cycle times during the production of single crystal silicon ingots.

However, successful performance of this process requires the operator to manually view and control, based on observation, the size of the island of unmelted silicon in the crucible as the granular polycrystalline silicon is fed onto the unmelted silicon. The size of the island is controlled by varying the side and bottom heater power and the feed rate at which granular polycrystalline silicon is fed onto the island. For example, if the island becomes too large, bridging of the island to the crucible wall becomes a concern and the operator decreases the feed rate. If the island becomes too small, there is a risk that granular polycrystalline will undesirably fall directly into the melt and the operator accordingly increases the feed rate. This practice can result in substantial variability in crystal quality due to differences in operators and the extent of operator attention during the melting process.

SUMMARY OF THE INVENTION

Among the several objects and features of the present invention may be noted the provision of a method and apparatus for preparing molten silicon melt from polycrystalline silicon in a crystal pulling apparatus; the provision of such a method and apparatus which increases consistency of crystal quality; the provision of such a method and apparatus which automatically control the rate at which polycrystalline silicon is fed into a crucible of the crystal pulling apparatus; the provision of such a method and apparatus which increase throughput of the crystal pulling apparatus; and the provision of such a method which can be carried out efficiently and economically and such apparatus which is economically feasible and commercially practical.

In general, a method of the present invention for preparing molten silicon melt from polycrystalline silicon in a crystal pulling apparatus comprises loading polycrystalline silicon into a crucible. The amount of polycrystalline silicon loaded into the crucible is substantially less than a predetermined total amount of polycrystalline silicon to be melted in the crucible. The crucible is then heated to melt down the polycrystalline silicon in the crucible to form a partially melted charge in the crucible. The partially melted charge comprises molten silicon having an upper surface and an island of unmelted polycrystalline silicon exposed above the upper surface of the molten silicon. Granular polycrystalline silicon is fed from a feeder onto the island of unmelted polycrystalline silicon in the crucible until the predetermined total amount of polycrystalline silicon has been loaded into the crucible. The position of the island of unmelted polycrystalline silicon relative to the side wall of the crucible is determined electronically, with this step being conducted as granular-polycrystalline silicon is fed onto the island of unmelted polycrystalline silicon in the crucible. The feed rate at which granular polycrystalline silicon is fed from the feeder onto the island of unmelted polycrystalline silicon is controlled in response to the determined position of the island of unmelted polycrystalline silicon relative to the crucible side wall at the upper surface of the molten silicon.

In another embodiment, apparatus of the present invention for preparing molten silicon melt from polycrystalline silicon in a crystal puller used for growing monocrystalline silicon ingots according to the Czochralski method comprises a heater for heating a crucible of the crystal puller to melt down polycrystalline silicon in the crucible to form a partially melted charge in the crucible comprising molten silicon having an upper surface in the crucible and an island of unmelted polycrystalline silicon exposed above the upper surface of the molten silicon. A feeder is adapted for feeding granular-polycrystalline silicon onto the island of unmelted polycrystalline silicon in the crucible. A camera is arranged for generating a video image signal of at least a portion of the crucible, the molten silicon and the island of unmelted polycrystalline silicon. A vision system is provided and is capable of electronically determining from the video image signal the position of the island of unmelted polycrystalline silicon relative to the crucible side wall. The feeder is in electrical communication with the vision system and is responsive to the determined position of the island of unmelted polycrystalline silicon relative to the crucible side wall to control the feed rate at which granular-polycrystalline silicon is fed from the feeder onto the island of unmelted polycrystalline silicon.

BRIEF DESCRIPTION OF THE DRAWINGS

Corresponding reference characters indicate corresponding parts throughout the several views of the drawings.

DETAILED DESCRIPTION OF THE INVENTION

Figure 1:
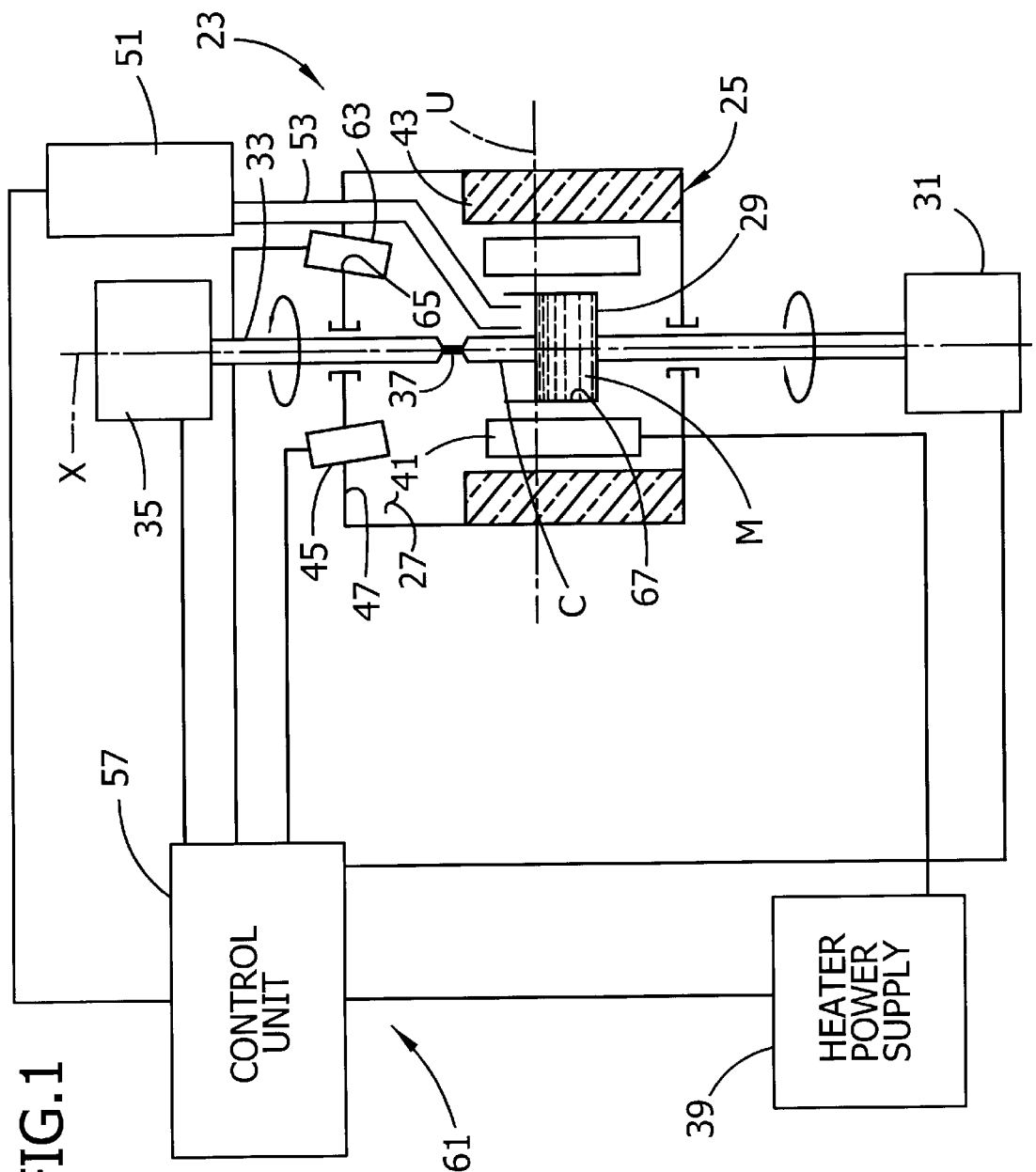
FIG. 1 is a schematic illustration of a crystal puller including apparatus of the present invention for preparing a molten silicon melt from polycrystalline silicon.

Now referring to the drawings, and in particular to FIG. 1, apparatus of the present invention is illustrated for use with a crystal puller, generally indicated at 23, of the type used to grow monocrystalline silicon ingots according to the Czochralski method. The crystal puller 23 includes a housing, generally indicated at 25, for isolating an interior which includes a crystal growth chamber 27. A quartz crucible 29 is supported in the growth chamber 27 and contains molten semiconductor source material M from which the monocrystalline silicon ingot is grown. A heater power supply 39 energizes a resistance heater 41 circumscribing the crucible 29 to form the molten silicon M in the crucible. Insulation 43 lines the inner wall of the housing 25. A crucible drive unit 31 rotates the crucible 29 in the clockwise direction, as indicated by the arrow, and raises and lowers the crucible during the growth process to maintain the surface of the molten source material M at a generally constant level as a crystal ingot C is grown and source material is removed from the melt.

A pulling mechanism includes a pull shaft 33 extending down from a crystal drive unit 35 capable of raising, lowering and rotating the pull shaft. The crystal puller 23 may have a pull wire (not shown) rather than a shaft 33, depending upon the type of puller. The pull shaft 33 terminates in a seed crystal chuck 37 which holds a seed crystal (not shown) used to grow the monocrystalline ingot C. According to the Czochralski crystal growth process, the crystal drive unit 35 rotates the pull shaft 33 in a direction opposite that of the crucible 29. As illustrated in FIG. 1, a viewing camera 45 is mounted in a view port 47 of the puller housing 25 for monitoring the growth of the ingot C.

A feeder 51 containing granular polycrystalline silicon is supported by the crystal puller 23 and has a feed tube 53 constructed of quartz depending therefrom and extending down through the puller housing 25 into the growth chamber 27 for feeding granular polycrystalline silicon into the crucible 29. The feed tube 53 is movable within the growth chamber 27 for selective positioning between a feeding position (FIG. 4) in which an outlet 55 of the feed tube is positioned over the crucible 29 to feed granular polycrystalline silicon into the crucible and a non-feeding position (not shown) in which the feed tube is positioned away from the crucible during growth of the ingot C. A control unit 57 is electrically connected to various operating components of the puller 23, such as the crucible drive unit 31, the crystal drive unit 35 and the heater power supply 39, to control operation of the crystal puller. The general construction and operation of the crystal puller 23, except to the extent explained more fully below, is well known to those of ordinary skill in the art and will not be further described.

Still referring to FIG. 1, apparatus of the present invention is generally indicated at 61 and comprises, in part, the feeder 51 and the control unit 57. The control unit 57 is in electrical communication with the feeder 51 for automatically controlling operation of the feeder. It is understood, however, that a control unit (not shown) separate from the control unit 57 used to control operation of the various components of the crystal puller 23 may be used to control operation of the feeder 51 without departing from the scope of this invention. The apparatus 61 also includes a two-dimensional camera 63 mounted on the housing 25 of the crystal puller 23 in electrical communication with the control unit 57 for continuously monitoring the crucible 29 and its contents during the melt. The camera 63 is mounted in a viewport 65 of the crystal puller housing 25 and is aimed generally at the intersection of the central axis X of the puller and an upper surface U of the molten silicon in the crucible.

For example, the camera 63 may be mounted at an angle of approximately 15°–34° with respect to the central axis X of the crystal puller 23. The camera 63 is preferably a monochrome charge coupled device (CCD) camera, such as a Sony XC-75 CCD video camera having a resolution of 768×494 pixels. Another suitable camera 63 is a Javelin SmartCam JE camera. The camera 63 is preferably equipped with a lens (not shown) providing a sufficiently wide field of view for generating images that include at least a portion of a side wall 67 (FIG. 4) of the crucible 29, a peripheral edge of unmelted silicon I exposed above the surface U of the molten silicon, and the molten silicon M intermediate the exposed unmelted silicon and the crucible sidewall. As a further example, the camera 63 of the preferred embodiment described hereinafter is equipped for viewing approximately 50%–75% of the crucible 29 and its contents. The crucible 29 and its contents are essentially self-illuminating such that an external light source for the camera 57 is not needed.

Figure 2:
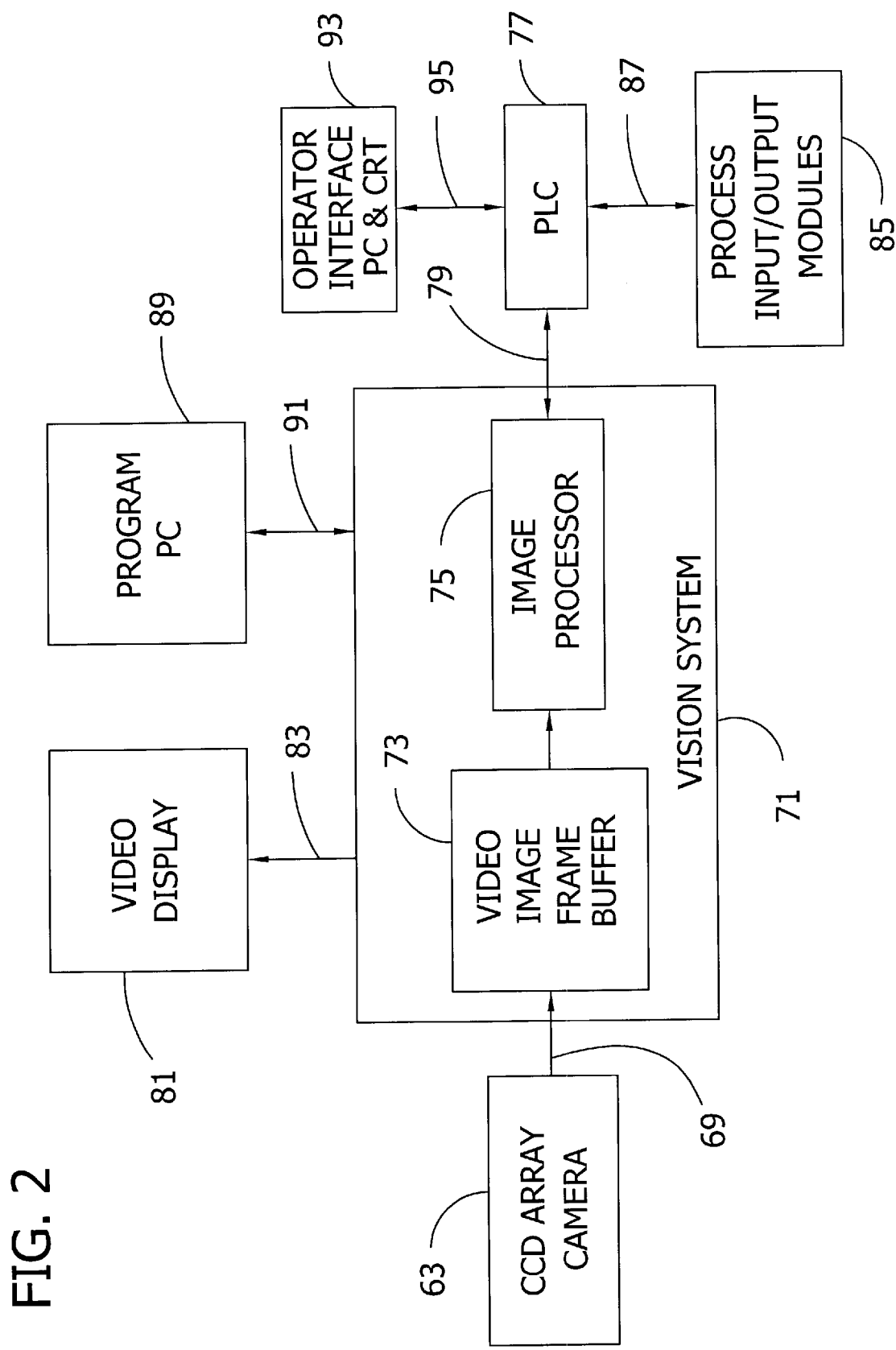
FIG. 2 is a block diagram of a control unit and camera of the apparatus of FIG. 1.

FIG. 2 illustrates a preferred embodiment of the control unit 57 in block diagram form. The camera 63 communicates video images via line 69 (e.g., RS-170 video cable) to a vision system 71. The vision system includes a video image frame buffer 73 and an image processor 75 for capturing and processing the video images. As an example, vision system 71 is a Cx-100 Imagenation Frame Grabber or a Cognex CVS-4400 vision system. In turn, vision system 71 communicates with a programmable logic controller (PLC) 77 via line 79. In one preferred embodiment, the PLC 77 is a Model 575 PLC or a Model 545 PLC manufactured by Texas Instruments and line 79 represents a communications interface (e.g., VME backplane interface).

Vision system 71 also communicates with a video display 81 via line 83 (e.g., RS-170 RGB video cable) for displaying the video image generated by camera 63 and with a computer 89 via line 91 (e.g., RS-232 cable) used to program the vision system. As illustrated in FIG. 2, the PLC 77 communicates with one or more process input/output modules 85 via line 87 (e.g., RS-485 cable). The process input/output modules 85 provide a path to and from the feeder 51 for automatically controlling operation of the feeder. An operator interface computer 93 also communicates with the PLC via line 95 (e.g., RS-232 cable) to permit the crystal puller operator to input desired operating parameters to the PLC and/or to retrieve operating information from the PLC during operation of the crystal puller 23.

Figure 3:
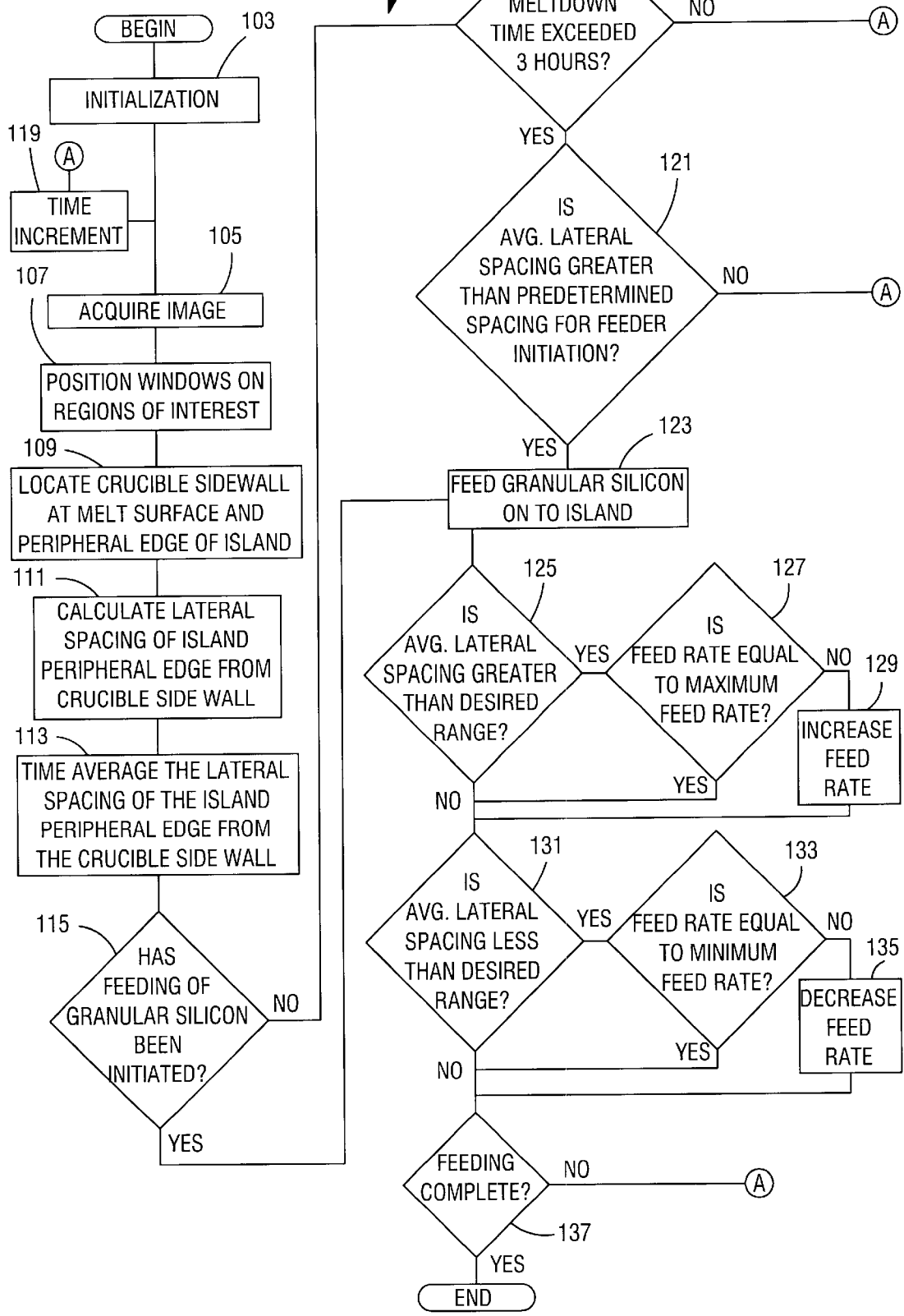
FIG. 3 is a flow diagram illustrating operation of the control unit of FIG. 2 in accordance with a method of the present invention for preparing a molten silicon melt from polycrystalline silicon.

Referring now to FIG. 3, a method of the present invention for preparing molten silicon melt proceeds according to a flow diagram, generally indicated at 101, to provide closed loop control of the feeder 51 using the apparatus 61 of the present invention. Beginning at step 103, the crystal puller 23, including the control unit 57, is initialized with predetermined parameter settings, which are discussed in more detail below, either already coded into the PLC 77 of the control unit or input to the PLC via the operator interface computer 93. As part of the initialization step 103, and in accordance with a preferred method of loading polycrystalline silicon into the crucible 29 as disclosed in co-assigned U.S. Pat. No. 5,588,993, which is incorporated herein by reference, a predetermined amount of polycrystalline silicon is loaded into the crucible. Although either granular-polycrystalline silicon or chunk-polycrystalline silicon could be used for the initial loading, chunk-polycrystalline silicon is generally preferred. The use of granular-polycrystalline silicon for the initial loading can result in relatively poor production yields and a high incidence of large void defects forming in the single crystal silicon ingot C. It is believed that the granular-polycrystalline silicon traps gasses such as argon or hydrogen at the bottom of the crucible 29, and that these gasses later release as bubbles into the silicon melt M during crystal growth. Some of the bubbles become attached to the crystal C at the crystal growth interface, thus forming void defects. The use of chunk-polycrystalline silicon for the initial loading avoids the formation of these void defects, and generally results in higher yields.

The predetermined amount of polycrystalline silicon initially loaded into the crucible 29 is preferably optimized with respect to the quality of the single crystal silicon ingot C and production throughput. If too much chunk-polycrystalline silicon is loaded into the crucible 29, higher mechanical stresses occur, and there is also an increased probability of the charge shifting or forming bridges or hangers. Economic, availability or other factors favoring granular polycrystalline silicon may also encourage minimizing the amount of chunk polycrystalline silicon in the initial load. However, if too little chunk-polycrystalline silicon is loaded into the crucible 29, a considerably greater amount of power is required to melt the charge. The higher temperatures of the crucible side wall 67 associated with the use of such higher power can result in premature crucible 29 degradation. In addition to these factors, the initial loading size will also vary with crucible design, hot zone design and the types of crystal products being produced. For example, in a 100 kg total charge using a 22 inch crucible 29, an initial loading of chunk polycrystalline silicon of 40–65 kg is preferred, with a loading of 50–60 kg being more preferred and a loading of 55 kg being most preferred.

Figure 4:
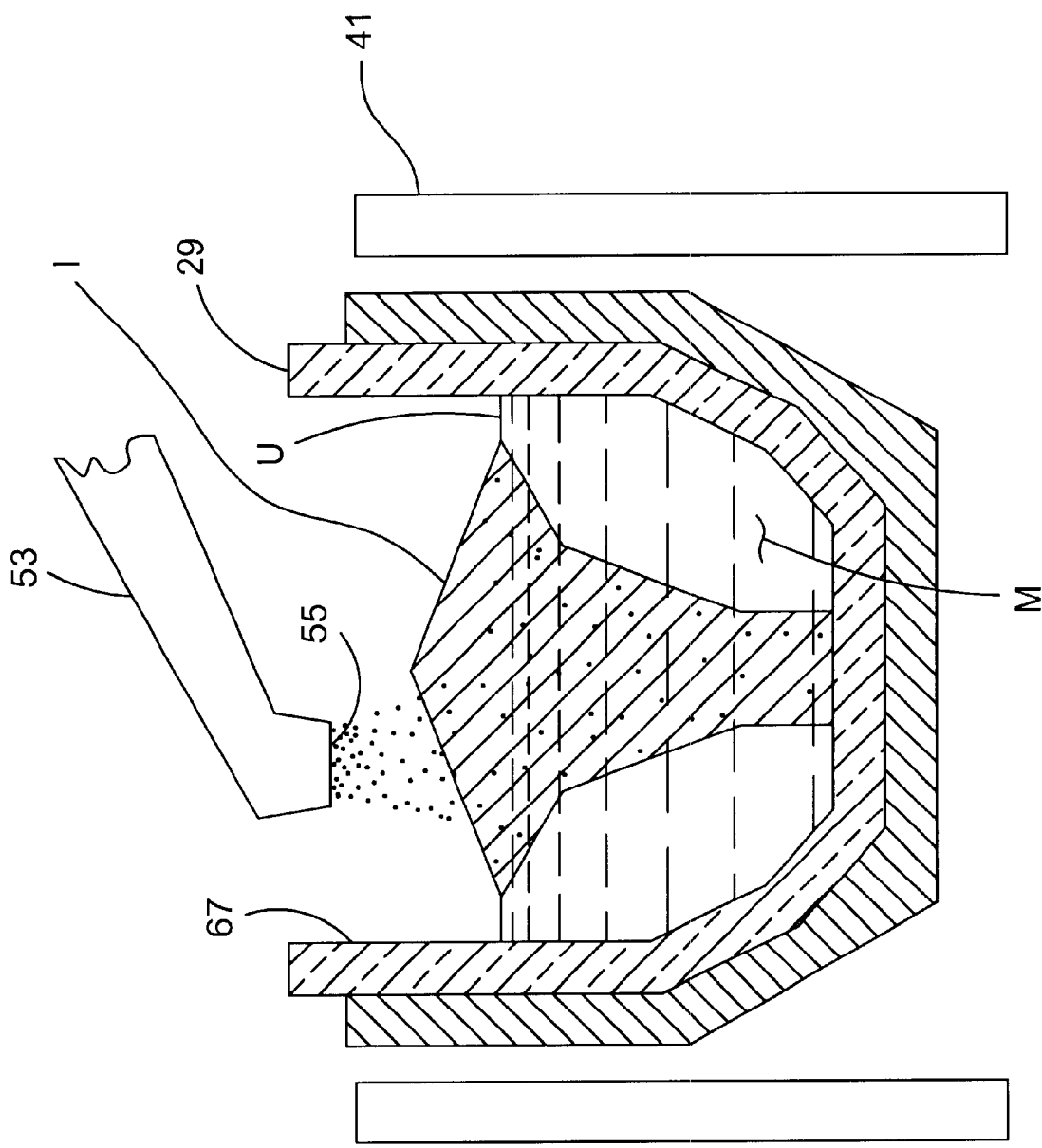
FIG. 4 is a partial section view of a crystal puller showing feeding of granular polycrystalline silicon onto a partially melted charge of polycrystalline silicon.

Also during initialization 103, the control unit 51 energizes the heater power supply 39 to power the heater 41 in the puller housing 25 for initiating melt down of the polycrystalline silicon initially loaded into the crucible 29. As shown in FIG. 4, initial melt down of the polycrystalline silicon results in a partially melted charge being formed in the crucible comprising both molten silicon M and unmelted polycrystalline silicon. Because of the heat radiated by the crucible, the polycrystalline silicon tends to melt progressively faster nearer the crucible side wall than at the center of the crucible. As a result, molten silicon M having a melt surface U, or melt level, begins to surround the unmelted polycrystalline, with an island I of unmelted polycrystalline silicon is at least partially exposed above the melt surface of the molten silicon. The island I starts off close to or may even be in contact with the crucible side wall and eventually shrinks as the peripheral edge of the island melts and becomes part of the molten silicon.

At step 105, as the initial load of polycrystalline silicon is being melted, the frame buffer 73 of vision system 71 captures an image from the video image signal of the camera 63 for processing by the image processor 75. In the preferred embodiment, an image is intermittently acquired and processed by the vision system 71, such as approximately ten times per minute (i.e., every six seconds), to monitor the melting polycrystalline silicon from various circumferential locations about the crucible 29 as the crucible (and the unmelted silicon in the crucible) rotates about the central axis X of the crystal puller 23.

The captured image comprises a plurality of pixels (not shown), with each pixel having a value representative of a detected optical characteristic of the image. In this instance, the pixel values, or gray levels, correspond to the light intensity of the pixels. At steps 107 and 109, the image processor 75 processes the image as a function of the pixel values to determine a location, or edge, of the crucible side wall 67 at the melt surface U and a peripheral edge of the island I of unmelted polycrystalline silicon generally laterally inward relative to the determined location of the crucible side wall. Locating edges in this manner is otherwise referred to as an edge detection method. Edges are generally defined as regions in the image where there is a relatively large change in gray level over a relatively small spatial region. Pixels corresponding to the crucible side wall 67 at the melt surface U and the peripheral edge of the island I of unmelted polycrystalline silicon have significantly higher gray levels, or pixel values (i.e., they appear brighter), than the molten silicon M intermediate the island and the crucible side wall and the central portion of the island I of unmelted silicon.

More particularly, at step 107 the image processor 75 defines at least two bounded regions (not shown) of interest in the image captured by the frame buffer 73. These regions of interest, also referred to as window regions or edge locating tools, are generally in the form of rectangular windows having a known set of coordinates relative to the image to enclose a known number of pixels in the region of interest. The position of each window region in the image is based on an estimated position of the edge to be located. For example, one window region of the present invention extends laterally from external of the crucible side wall 67 through the side wall into the molten silicon M in the crucible 29 to detect the coordinate location of the crucible side wall at the melt surface U within the window region. This window extends laterally into the molten silicon M a distance substantially less than a predetermined minimum spacing of the peripheral edge of the island I laterally inward from the crucible side wall 67, as will be discussed further below, so that the peripheral edge of the island will not be detected in this window region. By locating an edge (e.g., the crucible side wall at the melt surface) within the window region bounded by known coordinates, the coordinates of the located edge can be determined. The second window region extends laterally from interior of the crucible side wall 67, i.e., from within the molten silicon M, laterally inward a distance sufficient to overlay the island I of unmelted silicon in order to detect the peripheral edge of the island within this second window region. While using two separate window regions is preferred, however, it is contemplated that a single window region sized to extend through both the crucible 29 and the peripheral edge of the island I may be used without departing from the scope of this invention.

At step 109, an edge detection operator is performed to determine the coordinate locations of the crucible side wall 67 at the melt surface U and the peripheral edge of the island I using the window regions defined in the previous step. Various edge detection operators, or algorithms, for finding edges in an image are known to those skilled in the art. For example, suitable edge detection routines include Canny or Hough algorithms. It is to be understood that in addition to intensity, other characteristics of the image, such as intensity gradient, color or contrast, may be used to optically locate the edges of the crucible side wall 67 and the island I of unmelted silicon without departing from the scope of the present invention.

The image processor 75 reports the determined coordinate locations of the crucible side wall 67 and the peripheral edge of the island I to the PLC 77. At step 111 the PLC operates a routine to determine, based on the coordinate locations of the crucible side wall 67 and the peripheral edge of the island I, the lateral spacing of the island of unmelted silicon from the crucible side wall. Then, at step 113, a time averaged lateral spacing of the island I from the crucible side wall 67 is calculated over a predetermined number of successive time increments, e.g., 100, to filter out lateral size variations of the island of unmelted silicon. In the illustrated embodiment, the lateral spacing is calculated in terms of the number of pixels between the peripheral edge of the island I and the crucible side wall 67, i.e., the lateral coordinate of the crucible side wall subtracted from the lateral coordinate of the peripheral edge of the island. In the preferred embodiment, each pixel corresponds to a predetermined unit of length, for example about 1 mm.

At step 115, the PLC 77 determines whether the feeding of additional polycrystalline silicon into the crucible 29 has been initiated. If not, the PLC determines (step 117) whether a predetermined initial melt down time period has elapsed following power-up of the heater 41. The initial melt down time should be sufficient to permit partial melt down of polycrystalline silicon initially loaded into the crucible to form the island I of unmelted silicon surrounded by molten silicon. In the preferred embodiment, the initial melt down time is about three hours. If the initial melt down time has not lapsed, melt down of the initial load of polycrystalline silicon continues and the process proceeds to step 119 where the PLC 77 awaits for the next time increment (e.g., six seconds) before repeating the previous steps.

Once the initial melt down time has elapsed, the PLC 77 at step 121 determines whether the time averaged lateral spacing of the island I of unmelted polycrystalline silicon from the crucible side wall 67 exceeds a predetermined minimum spacing (i.e., the island I has sufficiently shrunk so that its peripheral edge is a desired distance inward away from the crucible side wall) above which feeding of additional polycrystalline silicon to the crucible 29 may be initiated. For example, in the preferred embodiment, the predetermined minimum spacing for activating the feeder 51 is 110 pixels (i.e., approximately 110 mm in the preferred embodiment). When the initial melt down time has elapsed and the predetermined minimum spacing of the island I from the crucible side wall 67 is surpassed, the control unit 57 signals the feeder 51 at step 123, via the input/output modules 85, to feed granular polycrystalline silicon down through the feed tube 53 for delivery onto the island I of unmelted silicon until the total amount of polycrystalline silicon has been loaded into the crucible 29.

As shown in FIG. 4, granular polycrystalline silicon is fed onto the island I of unmelted polycrystalline silicon generally toward the peripheral edge of the island as the island rotates conjointly with the crucible. While feeding granular polycrystalline silicon onto the center of the island I is acceptable, feeding it onto the peripheral edge has been found to result in formation of a more desirable wider, flatter island and is therefore preferred. In the method of the present invention, granular polycrystalline silicon is fed onto the island I at an initial feed rate of 10 kg/hr. The weight ratio of polycrystalline silicon initially loaded into the crucible 29 to granular polycrystalline silicon to be fed onto the island I is preferably between about 2:3 and about 2:1, and more preferably between about 1:1 and 3:2. In the example discussed previously, for a 100 kg total charge to a 22 inch crucible a 55 kg loading of chunk-polycrystalline silicon is most preferred, with the balance (e.g., 45 kg) of the total charge being fed onto the exposed island I of unmelted polycrystalline silicon as granular polycrystalline silicon. Granular polycrystalline silicon is generally easier to feed and results in a more uniform residence time as compared to chunk polycrystalline silicon. Preferably, the granular polycrystalline silicon is dust free and 90% of the granules (by weight) have a size distribution falling within the range of about 400 $\mu$m to about 1400 $\mu$m.

As polycrystalline silicon in the crucible 29 continues to melt, the granular polycrystalline silicon from the feeder 51 continues to form the island I above the melt surface U before the granules become immersed in the molten silicon M. While the granules of granular polycrystalline silicon are resident on the island I, the temperature of the granules rises quickly in a manner sufficient to allow the granular polycrystalline silicon to dehydrogenate while it is resident on the surface of the unmelted polycrystalline silicon and before it becomes immersed in the molten silicon M. Throughout the feeding of granular polycrystalline silicon onto the island I of unmelted polycrystalline silicon, the control unit 57 continues to acquire images (step 105) at the predetermined time intervals and process the images according to steps 107 to 113 to determine the average lateral spacing of the peripheral edge of the island I from the crucible side wall 67 at the upper surface U of the molten silicon M.

At step 125, the PLC 77 determines whether the average lateral spacing between of the peripheral edge of the island I from the crucible side wall 67 is within a predetermined acceptable range, for example 100–120 pixels (e.g., 100 mm–120 mm). If the average lateral spacing exceeds this range, the island I is getting undesirably small, thereby increasing the risk that granular polycrystalline will fall directly into the melt or otherwise melt too rapidly for dehydrogenation to occur. The PLC 77 proceeds to step 127 to determine whether the current feed rate at which granular polycrystalline silicon is discharged from the feeder 51 has already reached a predetermined maximum feed rate, e.g., 25 kg/hr. If so, no adjustment is made to the feed rate. Otherwise, the PLC 77 prompts feeder 51 (step 129), via the input/output module 85, to increase the feed rate by a predetermined increment, such as 5 kg/hr. Should the lateral spacing fall below the acceptable range, as determined at step 131, the island I is getting undesirably large. The PLC 77, at step 133, determines whether the current rate at which granular polycrystalline silicon is discharged from the feeder 51 has already reached a minimum feed rate of the feeder. If so, no adjustment is made to the feed rate. Otherwise, the PLC 77 prompts the feeder 51 (step 135), via the input/output module 85, to decrease the feed rate by a predetermined increment, such as 5 kg/hr.

Feeding continues until the total amount of silicon mass desired in the final silicon melt has been charged into the crucible 29, at which time the feeder is instructed to discontinue feeding granular polycrystalline into the crucible. In accordance with step 137, as long as feeding continues, the logic returns to step 119 until the next time increment is reached and the flow is repeated. After the feeding of granular polycrystalline silicon is complete, the bulk of the silicon in the crucible 29 is molten silicon M, with a relatively smaller amount of solidified silicon mass remaining. The granular polycrystalline silicon and the unmelted polycrystalline silicon, collectively comprising the remaining solidified silicon mass, are then further melted down to form a molten silicon melt.

In the apparatus 61 and method of the present invention as set forth above, an edge detection method is performed to electronically determine the position of the island I of unmelted polycrystalline silicon relative to the crucible side wall 67 at the melt surface U. However, other suitable methods may be used to determine the relative position of the island I relative to the crucible side wall 67, or to otherwise determine whether the rate at which granular polycrystalline silicon is fed to the crucible should be increased or decreased, without departing from the scope of this invention. It is contemplated that such other methods may be used as an alternative to the edge detection method or in conjunction therewith as a double check of the relative position of the island I relative to the crucible side wall 67.

For example, one such method locates the crucible side wall 67 at the upper surface U of the molten silicon M and defines a plurality (e.g., 10) of bounded regions, or boxes, extending laterally inward from the crucible side wall in side-by-side relationship a distance approximating the maximum desired lateral spacing of the island I from the crucible side wall (e.g., 120 mm). Each box laterally spans a predetermined number of pixels. The image processor 75 detects in which box the peripheral edge of the island I of unmelted polycrystalline silicon is located. The number of pixels corresponding to each of the boxes intermediate the crucible side wall 67 and the box in which the peripheral edge of the island I is detected is summed to determine the lateral spacing of the island from the crucible side wall.

Also, the relative position of the island I of unmelted polycrystalline silicon is determined in the illustrated embodiment by locating a peripheral edge of the island spaced generally laterally inward from the crucible side wall 67. However, other methods may be used to determine the position of the island I relative to the side wall 67 of the crucible 29 without departing from the scope of this invention. For example, a cross-sectional width of the island I may be determined and compared to the inner diameter of the crucible side wall 67. The inner diameter of the crucible side wall 67 may be predetermined and encoded in the PLC 77, or it may be calculated as a function of time, or it may be determined at each time step using the edge detection method or other suitable method. As another example, the surface area of the island I of unmelted polycrystalline silicon may be determined and compared to the cross-sectional area of the crucible 29. The cross-sectional area of the crucible 29 may be predetermined and encoded in the PLC 77, or it may be calculated as a function of time, or it may be determined at each time step.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method for preparing molten silicon melt from polycrystalline silicon in a crystal pulling apparatus, the method comprising:

loading polycrystalline silicon into a crucible, the amount of polycrystalline silicon loaded into the crucible being substantially less than a total amount of polycrystalline silicon to be melted in the crucible;

heating the crucible to melt down the polycrystalline silicon in the crucible to form a partially melted charge in the crucible, the partially melted charge comprising molten silicon having an upper surface and an island of unmelted polycrystalline silicon exposed above thee upper surface of the molten silicon;

selectively feeding granular-polycrystalline silicon from a feeder onto the island of unmelted polycrystalline silicon in the crucible at a feed rate until the total amount of polycrystalline silicon has been loaded into the crucible;

determining electronically the position of the island of unmelted polycrystalline silicon relative to the side wall of the crucible, said determining step being conducted as granular-polycrystalline silicon is fed onto the island of unmelted polycrystalline silicon in the crucible; and controlling the feed rate at which granular-polycrystalline silicon is fed from the feeder onto the island of unmelted polycrystalline silicon in response to the determined position of the island of unmelted polycrystalline silicon relative to the crucible side wall at the upper surface of the molten silicon.

2. The method of claim 1 wherein said step of determining electronically the position of the island of unmelted polycrystalline silicon relative to the side wall of the crucible comprises:

acquiring an image of at least a portion of the crucible, the molten silicon and the island of unmelted polycrystalline silicon in the crucible; and electronically processing the image to determine the lateral spacing between the crucible side wall and a peripheral edge of the island of unmelted polycrystalline silicon disposed in generally laterally spaced relationship with the crucible side wall.

3. The method of claim 2 wherein the step of electronically processing the image comprises electronically determining a coordinate location of the crucible side wall and a coordinate location of a peripheral edge of the island of unmelted silicon spaced generally laterally relative to the coordinate location of the crucible side wall; and electronically determining the lateral spacing between the peripheral edge of the island of unmelted polycrystalline silicon and the crucible side wall using the coordinate locations of the peripheral edge of said island and the crucible side wall.

4. The method of claim 2 wherein the step of controlling the feed rate at which granular-polycrystalline silicon is fed from the feeder onto the island of unmelted polycrystalline silicon comprises:

comparing the lateral spacing of the island of unmelted polycrystalline silicon from the crucible side wall to a range of lateral spacing;

controlling the feeder to increase the feed rate in response to said lateral spacing being above said range of lateral spacing; and controlling the feeder to decrease the feed rate in response to said lateral spacing being below said range of lateral spacing.

5. The method of claim 4 wherein the steps of controlling the feeder to selectively increase and decrease the feed rate of granular-polycrystalline silicon comprises electronically controlling said feeder in response to the lateral spacing of the island of unmelted silicon from the crucible side wall relative to the range of lateral spacing.

6. The method of claim 1 wherein said electronically determined position of the island of unmelted polycrystalline silicon relative to the side wall of the crucible is averaged over a number of intermittent determinations of said position.

7. The method of claim 1 further comprising, prior to the step of feeding granular-polycrystalline silicon from the feeder onto the island of unmelted polycrystalline silicon, the step of determining electronically the position of the island of unmelted polycrystalline silicon relative to the side wall of the crucible, said determining step being conducted as the polycrystalline silicon loaded into the crucible is melted to form said partially melted charge in the crucible, said step of feeding granular-polycrystalline silicon from the feeder onto the island of unmelted polycrystalline silicon in the crucible comprising initiating said feeding in response to the island of unmelted polyclystalline silicon being in a feed position in the crucible relative to the crucible side wall.

* * * * *